United States Patent
Robello et al.

[11] Patent Number: 5,712,079
[45] Date of Patent: Jan. 27, 1998

[54] BARRIER LAYER FOR LASER ABLATIVE IMAGING

[75] Inventors: Douglas R. Robello, Webster; Michael T. Swanson, Rochester; Scott E. Tunney, Ontario, all of N.Y.

[73] Assignee: Eastman Kodak Company, Rochester, N.Y.

[21] Appl. No.: 763,777

[22] Filed: Dec. 11, 1996

[51] Int. Cl.$^6$ .................................................. G03C 5/16
[52] U.S. Cl. ..................... 430/270.1; 430/200; 430/201; 430/945; 503/227
[58] Field of Search .......................... 503/227; 430/200, 430/201, 945, 270.1

[56] References Cited

U.S. PATENT DOCUMENTS

| | | | |
|---|---|---|---|
| 3,403,088 | 9/1968 | Hart | 204/498 |
| 5,246,909 | 9/1993 | Thien et al. | 430/200 |
| 5,459,017 | 10/1995 | Topel, Jr. et al. | 430/945 |
| 5,468,591 | 11/1995 | Pearce et al. | 430/201 |

OTHER PUBLICATIONS

Hackh's Chemical Dictionary, ©1944, p. 895.

*Primary Examiner*—Martin Angebranndt
*Attorney, Agent, or Firm*—Harold E. Cole

[57] ABSTRACT

An ablative recording element comprising a support having thereon, in order, a barrier layer and a colorant layer comprising a colorant dispersed in a polymeric binder, the element containing an infrared-absorbing material, and wherein the barrier layer is prepared from an aqueous latex dispersion of a polycyanoacrylate copolymer having the formula:

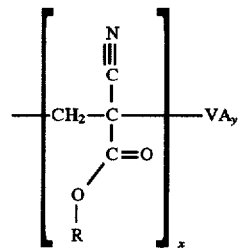

wherein:

R is a substituted or unsubstituted alkyl group having from 1 to about 20 carbon atoms, VA is a vinyl monomer with a pendant ionizable group, and the weight ratios of x:y range from about 97:3 to about 70:30.

10 Claims, No Drawings

BARRIER LAYER FOR LASER ABLATIVE IMAGING

This invention relates to the use of a barrier layer in a laser ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off substantially all of the image dye and binder at the spot where the laser beam hits the element. In ablative imaging, the laser radiation causes rapid local changes in the imaging layer thereby causing the material to be ejected from the layer. Ablation imaging is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission Dmin density value serves as a measure of the completeness of image dye removal by the laser.

U.S. Pat. No. 5,468,591 relates to a direct image recording film which has a barrier layer between the support and the image recording layer to prevent downward migration of dyes during the ablation process. The barrier layer itself is partially or completely ablated during imaging, resulting in acceptably low Dmin values. A typical barrier layer disclosed includes an infrared (IR)-absorbing dye and a binder copolymer of 80:20 wt-% poly(methyl cyanoacrylate-co-ethyl cyanoacrylate).

However, there is a problem with the above prior art barrier layer in that it is applied by coating from organic solvents, such as acetonitrile or acetone. The use of organic solvents in production coating is undesirable because of fire and health risks. Also, the solvent evaporating from the coating must be captured during manufacturing to prevent pollution, which is an expensive process.

Aqueous suspensions of polycyanoacrylates have been used in drug delivery systems; however, no method of producing thin films from these materials has been shown. In addition, cyanoacrylate copolymers with methacrylic acid have not been applied in the field of laser ablative imaging.

It is an object of this invention to provide an ablative recording element having low Dmin achieved with minimal exposure energy. It is another object of the invention to provide an ablative recording element having good film quality with low mottle and no defects. It is another object of the invention to provide an ablative recording element having good adhesion to both the support below and the image layer above. It is another object of the invention to provide an ablative recording element having resistance to the solvent system used to coat the image layer. It is another object of this invention to provide a single-sheet process which does not require a separate receiving element These and other objects are achieved in accordance with the invention which comprises an ablative recording element comprising a support having thereon, in order, a barrier layer and a colorant layer comprising a colorant dispersed in a polymeric binder, the element containing an infrared-absorbing material, and wherein the barrier layer is obtained from an aqueous latex dispersion of a polycyanoacrylate copolymer having the formula:

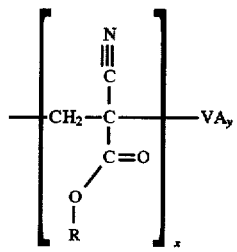

wherein:

R is a substituted or unsubstituted alkyl group having from 1 to about 20 carbon atoms, such as isopropyl, allyl, butyl, iso-butyl, tert-butyl, 2-methoxyethyl, 2-ethoxyethyl, hexyl, 2-ethylhexyl, etc.;

VA is a vinyl monomer, such as methacrylic acid, acrylic acid, vinyl phosphonic acid, vinyl sulfonic acid, sodium styrene sulfonate, vinyl pyridine, 2-acrylamido-2-methylpropane sulfonic acid, 2-(N,N, N-trimethylammonium)ethyl methacrylate chloride, 2-(N,N-diethylamino)ethyl methacrylate, etc.; said monomer having a pendant ionizable group, such as carboxylic acid, sulfonic acid, phosphonic acid, trialkylammonium, alkyl amine, etc.; and the weight ratios of x:y range from about 97:3 to about 70:30.

In a preferred embodiment of the invention, VA is —CH$_2$CR$^1$(COOH)—, wherein R$^1$ is hydrogen or methyl. In another preferred embodiment, the aqueous latex dispersion of a polycyanoacrylate copolymer is obtained by a) dissolving the copolymer in an organic solvent, b) dispersing the solution in water with agitation, and c) removing the organic solvent.

In another preferred embodiment, an infrared-absorbing material is added to the solution prepared in step a). In still another preferred embodiment, a base is added during step b). In yet still another preferred embodiment, a surfactant is added during step b). In yet another preferred embodiment, the pendant ionizable group is a carboxylic acid, sulfonic acid or phosphonic acid.

A polycyanoacrylate (PCA) barrier layer for laser ablative imaging elements is produced, according to this invention, by coating the material in the form of an aqueous latex, with optionally a small amount of organic solvent added as a coalescing aid to promote film formation. This coating process reduces hazardous emissions and eliminates the danger of fire which is present when conventional solvents are used. The performance of a barrier layer according to this invention is identical to that of a conventional solvent-coated layer.

Further, the PCA material of this invention is self-dispersing so that additional surfactant is optional. An IR-absorbing dye, which is necessary for laser ablative imaging, may also be directly incorporated into the latex, so that the film will absorb IR light from the laser and will be ablated in the imaging step. Typical IR-absorbing dyes include cyanine infrared-absorbing dyes as described in U.S. Pat. No. 4,973,572, the disclosure of which is hereby incorporated by reference. The IR-absorbing dye can be present in the barrier layer at between 2 and 60 wt-%, relative to the PCA copolymer barrier layer, and preferably between 10 and 30 wt-%.

The molecular weights of the PCA copolymers described above may be between 1,000 and 2,000,000 weight average molecular weight (polystyrene equivalent by size exclusion chromatography). Particularly good results have been obtained with polymers having a molecular weight between 2,000 and 500,000 weight average.

The PCA copolymers described above may also be copolymerized with other monomers. For example, the PCA copolymers may comprise copolymers of at least 50 wt. %, preferably more than 75 wt. %, of repeating units as described above along with other vinyl monomers such as acrylates and methacrylates, acrylamides and methacrylamides, vinyl ethers, vinyl alkyl esters, maleic anhydrides, maleimides, itaconic acid and esters, fumaric acid and esters, etc.

Examples of PCA copolymers useful in the invention include the following:

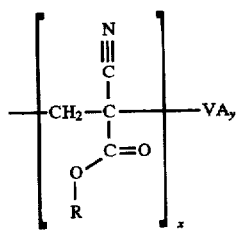

| Compound | R | VA | x | y |
|---|---|---|---|---|
| 1 | CH₃ | —CH₂—CH— <br> \|<br> C=O<br>\|<br>OH | 90 | 10 |
| 2 | CH₂CH₃ | —CH₂—CH— <br> \|<br> C=O<br>\|<br>OH | 95 | 5 |
| 3 | CH₃ | CH₃<br>\|<br>—CH₂—C—<br>\|<br>C=O<br>\|<br>OH | 95 | 5 |
| 4 | CH₂CH₃ | CH₃<br>\|<br>—CH₂—C—<br>\|<br>C=O<br>\|<br>OH | 70 | 30 |
| 5 | CH₂CH₃ | —CH₂—CH—<br>\|<br>C=O<br>\|<br>OH | 80 | 20 |
| 6 | CH₂CH₂OCH₃ | CH₃<br>\|<br>—CH₂—C—<br>\|<br>C=O<br>\|<br>OH | 95 | 5 |
| 7 | CH₂CH₂OCH₂CH₃ | —CH₂—CH—<br>\|<br>C=O<br>\|<br>OH | 75 | 25 |
| 8 | CH₂CH₂OCH₂CH₃ | CH₃<br>\|<br>—CH₂—C—<br>\|<br>C=O<br>\|<br>OH | 95 | 5 |
| 9 | CH₃, CH₂CH₃ (copolymer) | —CH₂—CH—<br>\|<br>C=O<br>\|<br>OH | 74: 21 | 5 |
| 10 | CH₃, CH₂CH₃ (copolymer) | CH₃<br>\|<br>—CH₂—C—<br>\|<br>C=O<br>\|<br>OH | 73: 21 | 6 |

5
-continued

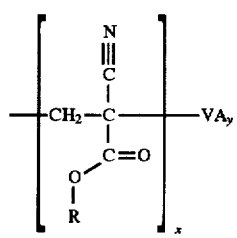

| Compound | R | VA | x | y |
|---|---|---|---|---|
| 11 | CH₂CH₂CH₃ | 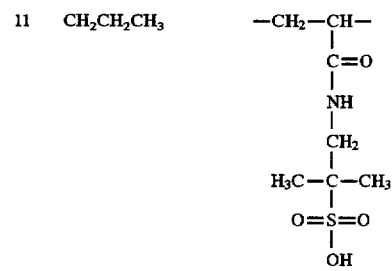 | 90 | 10 |
| 12 | CH₂CH₂CH₂CH₃ | 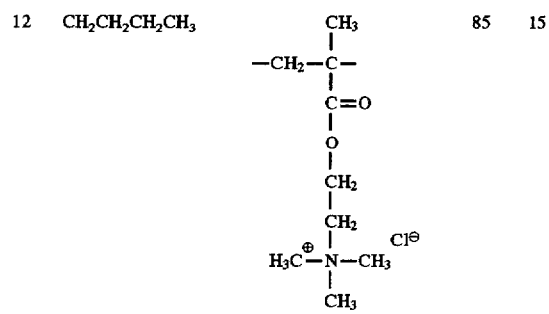 | 85 | 15 |
| 13 | CH₂CH(CH₃)₂ | 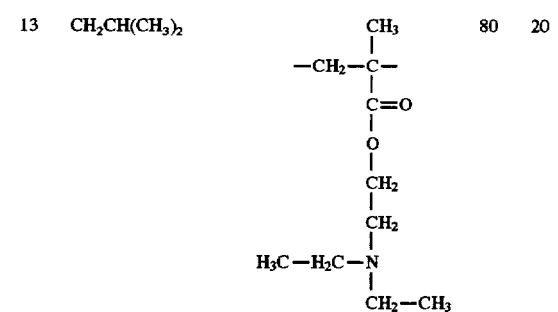 | 80 | 20 |
| 14 | CH₂CH(CH₂CH₃)-CH₂CH₂CH₂CH₃ | 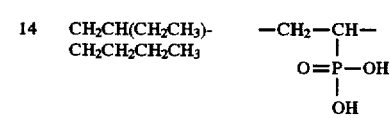 | 97 | 3 |
| 15 | CH(CH₃)₂ | 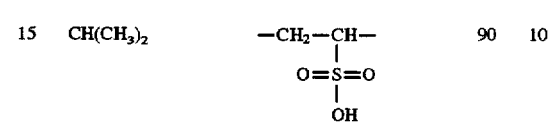 | 90 | 10 |

6
-continued

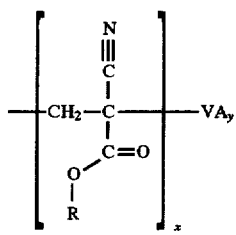

| Compound | R | VA | x | y |
|---|---|---|---|---|
| 16 | | 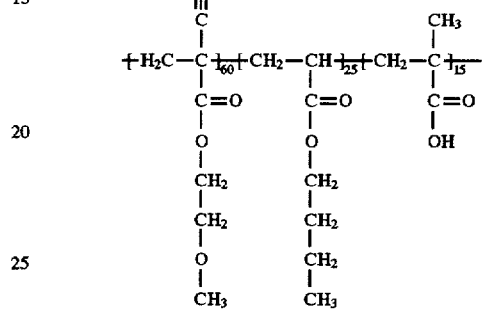 | | |

In preparing an aqueous latex formulation according to the invention, the particles coalesce into a fill as the water evaporates. Occasionally, a small amount of high-boiling, water-miscible organic solvent, known as a "coalescing aid", may be added to the formulation to promote film formation. The amount of volatile organic compounds is greatly reduced when an aqueous latex is employed, leading to increased environmental safety and reduced costs.

Another embodiment of the invention relates to a process of forming a single color, ablation image comprising imagewise heating by means of a laser, an ablative recording element described above, the laser exposure taking place through the colorant side of the element, and removing the ablated material, such as by means of an air stream, to obtain an image in the ablative recording element.

The PCA copolymer barrier layers of this invention are useful with imaging layers which contain any type of colorant such as visible or infrared dyes, ultraviolet dyes, pigments, etc.

While any coverage of barrier layer may be employed which is effective for the intended purpose, good results have been obtained at coverages of from about 0.05 to about 1.0 g/m², preferably 0.1 to about 0.5 g/m².

The ablation elements of this invention can be used to obtain medical images, reprographic masks, printing masks, etc. The image obtained can be a positive or a negative image.

The invention is especially useful in making reprographic masks which are used in publishing and in the generation of printed circuit boards. The masks are placed over a photosensitive material; such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high UV Dmax. If it does not do this, the printing plate would not be developable to give regions which take up ink and regions which do not.

The reduction in Dmin obtained with this invention is important for graphic arts applications where the Dmin/Dmax of the mask controls the exposure latitude for subsequent use. This also improves the neutrality of the Dmin for medical imaging applications. The dye removal process can be by either continuous (photographic-like) or halftone imaging methods.

The lower Dmin values achieved in accordance with the invention greatly expand the UV contrast of these ablative film elements, which enhances their usefulness when exposing UV-sensitive printing plates with UV radiation.

Any polymeric material may be used as the binder in the recording element employed in the process of the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); poly(cyanoacrylates); poly(vinyl halides) such as poly(vinyl chloride) and poly(vinyl chloride) copolymers; poly(vinyl ethers); maleic anhydride copolymers; polystyrene; poly(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m².

In a preferred embodiment, the polymeric binder used in the recording element employed in the process of the invention has a polystyrene equivalent molecular weight of at least 100,000 as measured by size exclusion chromatography, as described in U.S. Pat. No. 5,330,876.

To obtain a laser-induced, ablative image using the process of the invention, a diode laser is preferably employed since it offers substantial advantages in terms of its small size, low cost, stability, reliability, ruggedness, and ease of modulation. In practice, when an infrared-emitting laser is used to heat an ablative recording element, the element must contain an infrared-absorbing material, such as pigments like carbon black, or cyanine infrared-absorbing dyes as described in U.S. Pat. No 4,973,572, or other materials as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. The laser radiation is then absorbed into the colorant layer and converted to heat by a molecular process known as internal conversion. Thus, the construction of a useful colorant layer will depend not only on the hue, transferability and intensity of the colorant, but also on the ability of the colorant layer to absorb the radiation and convert it to heat. The infrared-absorbing material or dye may be contained in the colorant layer itself or in a separate layer associated therewith, such as the barrier layer below the colorant layer or in an overcoat layer. As noted above, the laser exposure in the process of the invention takes place through the colorant side of the ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

Any dye can be used in the ablative recording element employed in the invention provided it can be ablated by the action of the laser. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.);

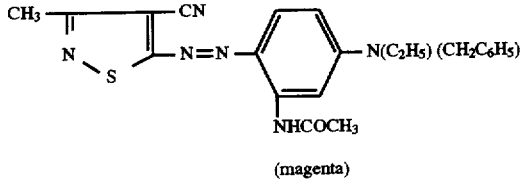

(magenta)

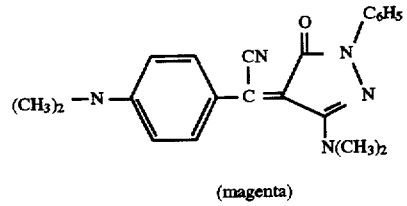

(magenta)

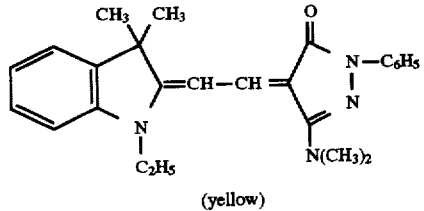

(yellow)

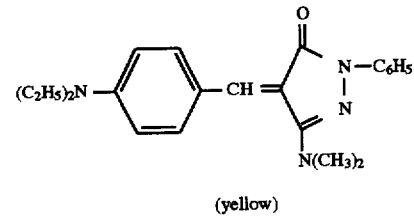

(yellow)

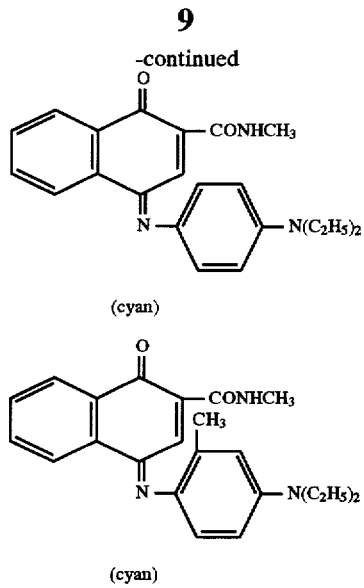

(cyan)

(cyan)

or any of the dyes disclosed in U.S. Pat. Nos. 4,541,830; 4,698,651; 4,695,287; 4,701,439; 4,757,046; 4,743,582; 4,769,360; and 4,753,922, the disclosures of which are hereby incorporated by reference. The above dyes may be employed singly or in combination. The dyes may be used at a coverage of from about 0.05 to about 1 g/m² and are preferably hydrophobic.

Pigments which may be used in the colorant layer of the ablative recording layer of the invention include carbon black, graphite, metal phthalocyanines, etc. When a pigment is used in the colorant layer, it may also function as the infrared-absorbing material, so that a separate infrared-absorbing material does not have to be used.

The colorant layer of the ablative recording element employed in the invention may be coated on the support or printed thereon by a printing technique such as a gravure process.

Any material can be used as the support for the ablative recording element employed in the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

The following dyes were used in the experimental work described below:

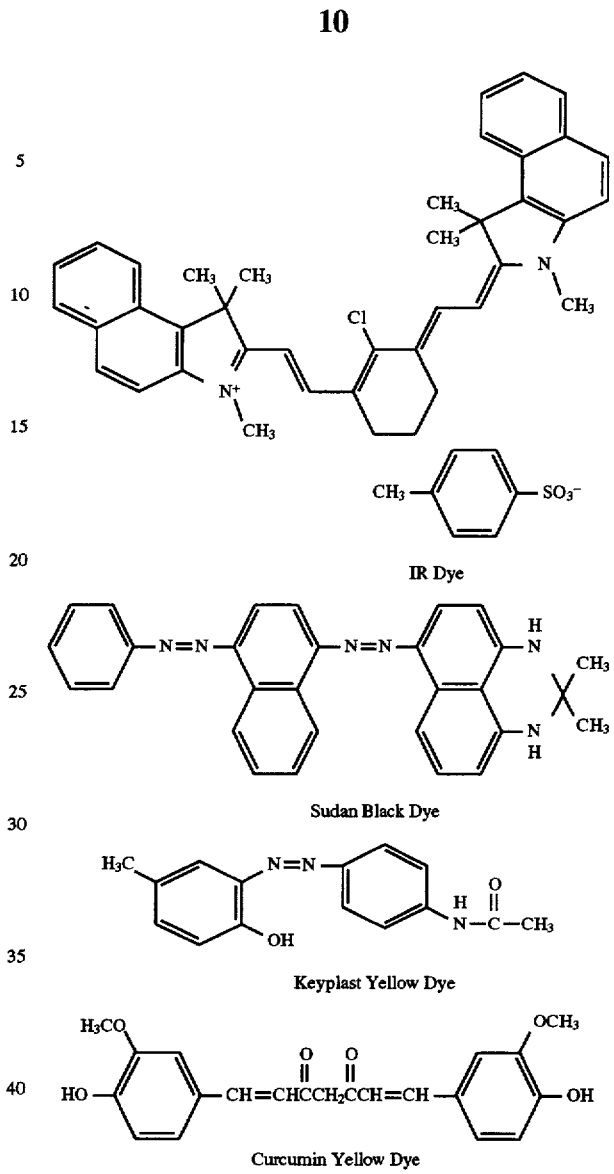

IR Dye

Sudan Black Dye

Keyplast Yellow Dye

Curcumin Yellow Dye

The general procedure used in forming the barrier layer aqueous latex coatings was based on the technique of evaporative dispersion. Solutions obtained from the monomer polymerization were directly dispersed in water, without actually isolating the solid polymer. Base was added to the water to ionize the pendant carboxylate groups. The base used was triethylamine, but any other base could have been used. The above IR dye was dissolved in a suitable solvent and co-dispersed along with the polymer. Then the solvents were stripped at reduced pressure, leaving an aqueous latex of polymer loaded with IR dye. Typical average particle size was 850 nm.

The following examples may serve to illustrate the production of aqueous dispersions according to the invention.

Example 1

Synthesis of 95% 2-methoxyethyl cyanoacrylate: 5% methacrylic acid copolymer

A 125 mL heavy-walled bottle was rinsed with 5% HCl and then dried at 150° C. for 2 hrs. A stream of nitrogen was run into the bottle while it was cooling and throughout the addition of reagents. Methacrylic acid (0.5 g) was added to the bottle followed by 12 g ethyl acetate and 0.07 g azobisisobutyronitrile (AIBN). The AIBN was allowed to dissolve, followed by addition of 11.4 g 2-methoxyethyl cyanoacrylate. The bottle was sealed with a Teflon seal and an aluminum cap, and then tumbled at 60° C. in a constant temperature bath for 16 hrs. The resulting polymer solution was diluted to 20% solids with 95% ethyl acetate: 5% methanol, and used directly to make dispersions.

Example 2

Synthesis of 95% methyl cyanoacrylate: 5% methacrylic acid copolymer

The procedure from Example 1 was followed using 19 g methyl cyanoacrylate, 1 g methacrylic acid, and 0.06 g AIBN.

Example 3

Synthesis of 95% 2-ethoxyethyl cyanoacrylate: 5% methyacrylic acid copolymer

The procedure from Example 1 was followed using 10 g of 2-ethoxyethyl cyanoacrylate, 1.0 g methyacrylic acid, and 0.07 g of AIBN.

Example 4

Synthesis of 73% methyl cyanoacrylate: 21% ethyl cyanoacrylate: 6% methacrylic acid copolymer The procedure from Example 1 was followed using 7.33 g methyl cyanoacrylate, 2.06 ethyl cyanoacrylate, 0.6 g methacrylic acid, 10 g ethyl acetate, and 0.03 g AIBN.

Example 5

Synthesis of 95% ethyl cyanoacrylate: 5% acrylic acid copolymer

The procedure from Example 1 was followed using 4.75 g ethyl cyanoacrylate, 0.25 g of acrylic acid, 5 g tetrahydrofuran (THF), 0.015 g of AIBN, and 0.134 mL of glacial acetic acid. (Acetic acid was added just after solvent had been added.)

Example 6

Synthesis of 74% methyl cyanoacrylate: 21% ethyl cyanoacrylate: 5% acrylic acid copolymer The procedure from Example 1 was followed using 3.78 g methyl cyanoacrylate, 1.04 g ethyl cyanoacrylate, 0.25 g acrylic acid, 0.015 g AIBN, and 0.134 mL glacial acetic acid. (Acetic acid was added just after solvent had been added.)

Example 7

Synthesis of 60% 2-methoxyethyl cyanoacrylate: 15% methacrylic acid: 25% butyl acrylate copolymer The procedure from Example 1 was followed using 6.05 g 2-methoxyethyl cyanoacrylate, 1.5 g methacrylic acid, 2.5 g butyl acrylate, 10 g THF, and 0.07 g AIBN.

Example 8

Synthesis of 70% ethyl cyanoacrylate: 30% methacrylic acid copolymer

A 2 L three-necked round-bottom flask was acid rinsed, dried for 2 hrs. at 150° C., and blanketed with nitrogen while cooling and throughout addition of reagents. The following reagents were added: 51 g methacrylic acid, 680 g chlorobenzene, 0.51 g AIBN, and 119 g ethyl cyanoacrylate. The flask was fitted with an overhead stirrer and a condenser topped with a nitrogen bubbler. The flask was put into a constant temperature bath at 60° C. and stirred for 15 hrs. The resulting polymer solution was precipitated into a mixture of methanol and water and the polymer isolated by filtration. The dried polymer was dissolved to 20% solids with 95% ethyl acetate: 5% methanol, and then used to make dispersions.

Example 9

Typical dispersion procedure

The polymer solution from Example 1 was mixed with 45 g THF, 8 g methanol, and 1.43 g IR Dye. Pluronics® F108 surfactant (BASF Co.) (0.08 g) was dissolved in 105 g water with mild warming over 15 min. The aqueous solution was cooled to 25° C., and 1.45 mL triethylamine was added. The organic phase was poured into a 500 mL plastic bottle and placed under a Silverson homogenizer (Model L4R) with a dispersing head just slightly smaller than the diameter of the bottle. The homogenizer was turned on to ¾ power, and the aqueous solution was added slowly to the organic solution. The resulting dispersion was concentrated by rotary evaporation at 25 mm pressure and at a temperature below 40° C. Ninety-one grams of solvent were removed. The dispersion was filtered successively through 40–60 μm and 10–15 μm porosity glass filters. The resulting dispersion contained 6.60% total solids and 5.73% polymer.

Typical coating procedure for test sample

The dispersion from Example 9 (47.80 g) was mixed with 0.55 Zonyl FSN® surfactant (DuPont) and 0.90 g of N-methylpyrrolidinone (NMP), and coated to provide a coverage of 0.51 g/m$^2$.

The resulting barrier layer was overcoated with a colorant layer consisting of 0.22 g/m$^2$ IR Dye, 0.41 g/m$^2$ Keyplast Yellow Dye, 0.14 g/m$^2$ Curcumin Yellow Dye, 0.60 g/m$^2$ nitrocellulose, and 0.24 g/m$^2$ Sudan Black Dye coated from an 80/20 (wt/wt) mixture of 4-methyl-2-pentanone/ethanol.

Imaging Procedure

The samples so prepared were imaged with a diode laser imaging device as described in U.S. Pat. No. 4,876,235. The laser beam had a wavelength range of 800–830 nm and a nominal power output of 200 m Watts at the end of the optical fiber. The rotational speed of the drum was varied to produce exposures ranging from approximately 500–800 mJ/cm$^2$. The UV density of the imaged regions was measured using an X-Rite® 361T Photographic Densitometer (X-Rite Corp., Grandville, Mich.). Results are shown in the Table below for the barrier polymer from Example 1.

TABLE

| | D-min | | | |
| --- | --- | --- | --- | --- |
| Exposure (mJ/cm$^2$) | Solvent-Coated PCA* Barrier | Aqueous PCA** Barrier (+0.75% NMP***) | Aqueous PCA** Barrier (+1.00% NMP***) | Aqueous PCA** Barrier (+1.25% NMP***) |
| 536 | 0.0760 | 0.0900 | 0.0870 | 0.0790 |
| 574 | 0.0720 | 0.0780 | 0.0810 | 0.0710 |
| 618 | 0.0710 | 0.0730 | 0.0680 | 0.0650 |
| 670 | 0.0700 | 0.0720 | 0.0670 | 0.0620 |

TABLE-continued

| | | D-min | | |
|---|---|---|---|---|
| Exposure (mJ/cm$^2$) | Solvent-Coated PCA* Barrier | Aqueous PCA** Barrier (+0.75% NMP***) | Aqueous PCA** Barrier (+1.00% NMP***) | Aqueous PCA** Barrier (+1.25% NMP***) |
| 730 | 0.0690 | 0.0690 | 0.0640 | 0.0620 |
| 803 | 0.0690 | 0.0680 | 0.0660 | 0.0610 |

*The polymer for the solvent-coated barrier was a copolymer of a commercially available mixture (ca. 80:20 wt-% of a methyl cyanoacrylate and ethyl cyanoacrylate).
**The polymer for the aqueous barrier was a 95:5 copolymer of methyl cyanoacrylate and methacrylic acid (see Example 1, above).
***NMP = N-methylpyrrolidinone, coalescing aid The above results show that the Dmin values for the aqueous barrier layers of the invention are substantially equivalent to the D-min values obtained for the solvent-coated barrier layer of the prior art, without the disadvantages associated with using such a layer.

The invention has been described in detail with particular reference to preferred embodiments thereof, but it will be understood that variations and modifications can be effected within the spirit and scope of the invention.

What is claimed is:

1. A process of forming a single color, ablation image comprising imagewise heating by means of a laser, an ablative recording element comprising a support having thereon, in order, a barrier layer and a colorant layer comprising a colorant dispersed in a polymeric binder, said element containing an infrared-absorbing material, said laser exposure taking place through the colorant side of said element, and removing the ablated colorant to obtain said image in said ablative recording element, wherein said barrier layer is obtained from an aqueous latex dispersion of a polycyanoacrylate copolymer having the formula:

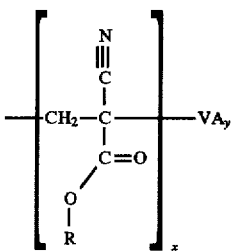

wherein:

R is a substituted or unsubstituted alkyl group having from 1 to about 20 carbon atoms, VA is a repeating unit resulting from the polymerization of a vinyl-containing monomer with a pendant ionizable group, and the weight ratios of x:y range from about 97:3 to about 70:30.

2. The process of claim 1 wherein VA is —CH$_2$CR$^1$(COOH)—, wherein R$^1$ is hydrogen or methyl.

3. The process of claim 1 wherein said aqueous latex dispersion of a polycyanoacrylate copolymer is obtained by
 a) dissolving said copolymer in an organic solvent,
 b) dispersing the solution in water with agitation, and
 c) removing said organic solvent.

4. The process of claim 3 wherein an infrared-absorbing material is added to the solution prepared in step a).

5. The process of claim 3 wherein a base is added during step b).

6. The process of claim 3 wherein a surfactant is added during step b).

7. The process of claim 1 wherein said pendant ionizable group is a carboxylic acid, sulfonic acid or phosphonic acid.

8. The process of claim 1 wherein said barrier layer is present at a coverage of from about 0.05 to about 1.0 g/m$^2$.

9. The process of claim 1 wherein said colorant is a dye.

10. The process of claim 1 wherein said colorant layer has an infrared-absorbing material associated therewith.

* * * * *